United States Patent [19]

Yamada et al.

[11] 4,223,237
[45] Sep. 16, 1980

[54] TRIGGER PULSE FORMING CIRCUIT

[75] Inventors: Tsuneo Yamada; Yukihiko Miyamoto, both of Tokyo, Japan

[73] Assignee: Trio Kabushiki Kaisha, Tokyo, Japan

[21] Appl. No.: 967,640

[22] Filed: Dec. 8, 1978

[30] Foreign Application Priority Data

Mar. 15, 1978 [JP] Japan ............................. 53-29650
Mar. 15, 1978 [JP] Japan ............................. 53-29651

[51] Int. Cl.$^2$ ............................................. H03K 5/08
[52] U.S. Cl. ......................... 307/268; 307/230; 307/246; 328/127
[58] Field of Search ............... 307/230, 268, 246; 328/127

[56] References Cited

U.S. PATENT DOCUMENTS

| 3,213,290 | 10/1965 | Klein et al. | 307/268 |
| 3,454,792 | 7/1969 | Horlander | 307/268 X |
| 3,702,944 | 11/1972 | Shigaki | 307/246 |

*Primary Examiner*—John S. Heyman
*Attorney, Agent, or Firm*—Gerald J. Ferguson, Jr.; Joseph J. Baker

[57] ABSTRACT

A trigger pulse forming circuit comprising a first power supply; a second power supply whose voltage is less than that of the first power supply, a differential amplifier including a first transistor whose operating voltage is supplied from the first power supply and a second transistor whose operating voltage is supplied from a second power supply, at least the first transistor being adapted for application thereto of an input pulse signal; a load resistor connected to an output terminal of the first transistor; an integrating circuit connected to an output terminal of the second transistor; and a third transistor whose base and collector are connected respectively to opposite ends of the integrating circuit and its emitter is connected to the output terminal of the first transistor whereby the trigger pulse output is obtained from the output terminal of the first transistor. A diode may preferably also be included, the anode of the diode being connected to the output terminal of the second transistor and the cathode thereof being connected to the second power supply whereby the probability of the trigger pulse output saturating the transistors of the next stage is substantially lessened.

6 Claims, 7 Drawing Figures

TRIGGER PULSE FORMING CIRCUIT

RELATED APPLICATIONS

This application is related to U.S. Application Ser. No. 859,539, filed Dec. 12, 1977, U.S. Pat. No. 4,182,963 and two other U.S. Applications filed by the same applicants on the same date as the present application, the two other applications both being entitled "Improved Monostable Multivibrator".

BACKGROUND OF THE INVENTION

This invention relates to an improvement in trigger pulse forming circuitry that form trigger pulses synchronized with input pulse signals.

Conventionally, differentiating circuits comprised of resistors and capacitors have been used as trigger pulse forming circuits to trigger monostable multivibrators, etc. However, differentiating circuits have shortcomings in that they do not form a trigger pulse with stable pulse width or amplitude due to the rise and fall time of the input pulse signal and the irregularity of the time constants of the differentiating circuit.

Consequently, a known circuit as shown in FIG. 1 may be used to avoid the foregoing problems, the FIG. 1 circuitry generally corresponding to that disclosed in co-pending application Ser. No. 859,539, filed Dec. 12, 1977, which is incorporated herein by reference. FIG. 1 is a schematic drawing which shows a trigger pulse forming circuit and a pulse shaping circuit that shapes the output of the trigger pulse forming circuit. The trigger pulse forming circuit constitutes an emitter-coupled differential amplifier in which the emitters of transistors 1 and 2 are connected in common and grounded through a constant current source 3. The collector of transistor 1 is connected to the power supply $+B_2$ through a load resistor 4, the collector of transistor 2 is connected to a power supply $+B_1$ through an integrating circuit comprising a load resistor 5 and a capacitor 6 and the outputs of transistors 1 and 2 are applied to AND diodes 8 and 9. The pulse shaping circuit comprises a current switching circuit that consists of transistors 10 and 11 and a constant current source 12. The voltage $+V_{B1}$ of power supply $+B_1$ and the voltage $+V_{B2}$ of power supply $+B_2$ are set so that $V_{B1} > V_{B2}$.

The output pulse of transistor 2 is integrated where the output pulses at the collectors of transistors 1 and 2 are mutually phase-reversed and derived from the input pulse signal impressed on the input terminal IN. The logical product of the above integrated output pulse and the output pulse from transistor 1 is derived from diodes 8 and 9 and used to form the trigger pulse. A shaped trigger pulse is obtained by shaping the waveform with a current switching circuit including transistor 10 and 11. 7 and 15 are power supplies for establishing threshold levels.

When the above-mentioned trigger pulse forming circuit is converted to an integrated circuit, it is desirable to minimize the electrostatic capacitance of capacitor 6 of the integrating circuit. Therefore, as the electrostatic capacitance of capacitor 6 is reduced, the resistance of load resistor 5 must be increased and the current of constant current source 3 reduced. Consequently, the output impedance of the trigger pulse forming circuit increases and the capacity to drive, for example, the pulse shaping circuit, level shifter, or flip-flop circuit in the next stage decreases. In other words, the FIG. 1 circuitry has a shortcoming in that a stable trigger pulse cannot be formed with respect to the irregularities in the values of circuit elements and changes in ambient conditions such as ambient temperature. Thus, there is a problem in converting it to an integrated circuit.

SUMMARY OF THE INVENTION

This invention was made in view of the above-mentioned problem and the object is to produce a trigger pulse forming circuit without the above shortcoming.

A further object of this invention is to provide a trigger pulse forming circuit which does not saturate the transistors of a phase-inverting pulse shaping circuit connected to the pulse forming circuit.

This invention is characterized by an emitter-coupled differential amplifier that includes a first transistor whose voltage is supplied from a first power supply and a second transistor whose voltage is supplied from a second power supply having a different voltage than that of the first power supply, and to which a pulse signal is impressed; a load resistor connected to the output terminal of the first transistor; an integrating circuit connected to the output terminal of the second transistor; a third transistor whose base and collector connect respectively to the two ends of the said integrating circuit and whose emitter is connected to the output terminal of the first transistor; and an optional diode whose anode is connected to the output terminal of the second transistor and whose cathode is connected to the second power supply where a trigger pulse output is obtained from the output terminal of the first transistor.

Other objects and advantages of this invention will be apparent from a reading of the following specification and claims taken with the drawing.

DETAILED DESCRIPTION OF PREFERRED EMBODIMENTS

Figure 1:
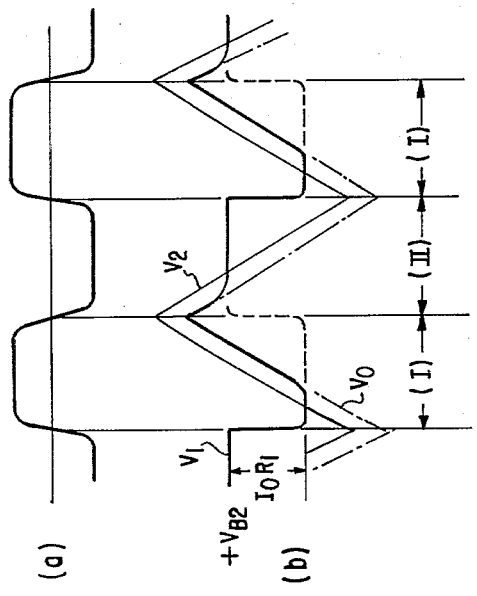
FIG. 1 is a circuit diagram of a trigger pulse forming circuit to which a pulse shaping circuit is connected.

In the drawing like reference numerals refer to like parts.

Figure 2:
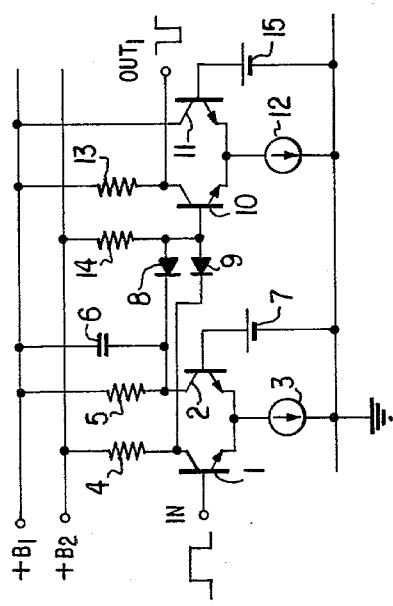
FIG. 2 is a circuit diagram of an illustrative trigger pulse forming circuit in accordance with the present invention.

FIG. 2 is a circuit diagram of one embodiment of the trigger pulse forming circuit of this invention where 16 and 17 are transistors. The emitters of transistors 16 and 17 are connected in common and grounded through a constant current source 18 to form an emitter-coupled differential amplifier. An input pulse signal is impressed between the bases of transistors 16 and 17. The collector of transistor 16 is connected to a power supply $+B_2$ through a load resistor 19, and the collector of transistor 17 is connected to power supply $+B_1$ through an integrating circuit comprising a load resistor 20 and a capacitor 21 which is connected in parallel to the load resistor 20. The collector of transistor 16 is also connected to an output terminal OUT as well as to the emitter of a transistor 22. The base of transistor 22 is connected to the collector of transistor 17 and the collector of transistor 22 to power supply $+B_1$. Thus, the base and collector of transistor 22 are connected to the two terminals of the integrating circuit.

However, the collector of transistor 22 can be connected to another power supply (not shown in the drawing) whose voltage is equal or higher than that of power supply $+B_1$, instead of to power supply $+B_1$.

The voltage $V_{B1}$ of power supply $+B_1$ is set higher than the voltage $V_{B2}$ of power supply $+B_2$. For example, a proper pulse width is obtained when they are so set that $V_{B1}-V_{B2} \cong ((R_2-R_1)I_0/2)+V_{BE3}$ where $I_0$ is the current of the constant current source 18; $R_1$ is the resistance of load resistor 19; $R_2$ is the resistance of load resistor 20 and $V_{BE3}$ is the voltage between the base and emitter of transistor 22.

Figure 3:
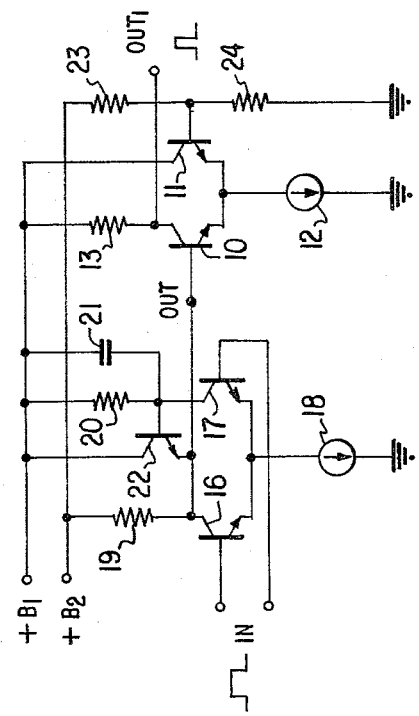
FIGS. 3(a) and (b) are diagrams of waveforms explaining the operation of the circuit shown in FIG. 2.

The operation of the trigger pulse forming circuit of FIG. 2 will now be described. When an input pulse signal such as shown in FIG. 3(a) is impressed between the bases of transistors 16 and 17 as an input and a certain level set as a threshold level, transistor 16 becomes conductive when the input pulse signal exceeds the threshold level, and transistor 17 becomes nonconductive. This state is shown as state (I). When the input pulse signal decreases below the above level, transistor 16 becomes nonconductive, and transistor 17 becomes conductive. This state is shown as state (II).

First, when the input pulse signal changes from the state (II) to state (I), transistor 16 changes from nonconductive to conductive, and transistor 17 changes from conductive to nonconductive. And, as shown in FIG. 3(b), the collector voltage $V_1$ of transistor 16 changes from the voltage $V_{B2}$ of the power supply $+B_2$ to $(V_{B2}-I_0R_1)$. On the other hand, the load of capacitor 21 is discharged because transistor 17 becomes nonconductive and the collector voltage $V_2$ of transistor 17 increases according to the time constant defined by the product of the resistance $R_2$ of load resistor 20 and the electrostatic capacitance C of capacitor 21, $R_2 \cdot C$, until the state is switched to state (II) or becomes $V_{B1}$. The collector voltage $V_1$ of transistor 16 is now at $(V_{B2}-I_0R_1)$ level as stated previously. However, when the forward voltage drop between the base and the emitter of transistor 22 is $V_{BE3}$, the transistor 22 becomes conductive in the range where the $V_2-V_{BE3} > V_{B2}-I_0R_1$ relation holds for transistor 22. The collector voltage $V_1$ of transistor 16 then becomes $(V_2-V_{BE3})$ and increases with the collector voltage $V_2$ of transistor 17. In FIG. 3(b), the dot and line curve $V_0$ shows the changes in the $V_0=(V_2-V_{BE3})$ values.

Next, when the state of the input pulse signal changes from state (I) to state (II), transistor 16 becomes nonconductive and transistor 17 becomes conductive. The collector voltage $V_2$ of transistor 17 decreases according to the characteristic of constant current source 18 and capacitor 21 until the state of the input pulse signal switches to state (I) again, or when $V_2=V_{B1}-I_0R_2$ results. Meanwhile, the collector voltage $V_1$ of transistor 16 tends to approach the voltage of the power supply $+B_2$, $V_{B2}$. But, while the transistor 22 is conductive, the potential is determined by $V_2$, and it becomes $V_{B2}$ when the transistor 22 becomes nonconductive. Then, it remains at the voltage $V_{B2}$ until the next switching time to state (I). Subsequently, the state of the input pulse signal changes from state (II) to state (I) and one cycle is completed.

The above operation indicates that the collector voltage $V_1$ of transistor 16, namely the voltage outputted at the output terminal OUT, is, because of transistor 22, the voltage of the higher side of either the collector voltage of transistor 16 when the collector of transistor 16 and the emitter of transistor 22 are disconnected, i.e. transistor 22 is not used, as shown with a broken line in FIG. 3(b) or the emitter voltage $(V_2-V_{BE3})$ of the transistor 22 shown as $V_0$ in FIG. 3(b). This is equivalent to performing an AND-operation with transistor 22 for the collector voltage of transistor 16, when the collector of the transistor 16 and the emitter of the transistor 22 are disconnected, and the emitter voltage $(V_2-V_{BE3})$ of the transistor 22, in a positive logic, and it forms a trigger pulse that is synchronized to the input pulse signal.

Thus, even though the electrostatic capacitance of capacitor 21 is set low and the resistance of load resistor 20, high, in order to change the circuit shown in FIG. 2 to an integrated circuit, the output impedance of the trigger pulse forming circuit decreases because of impedance conversion by transistor 22. Thus, sufficient driving capacity exists to drive circuits such as the pulse shaping circuit, level shifter, flip-flop in the next stage, and the problem of conversion to an integrated circuit is eliminated.

As a modified embodiment of the FIG. 2 circuit, one may serially connect two divider resistors between the power supply $+B_1$ and the ground terminal, connect the common connection point of the two divider resistors to the base of transistor 17, divide the voltage $V_{B1}$ of the power supply $+B_1$, and use the voltage impressed on the divider resistor on the ground side of the two divider resistors as the base input of transistor 17.

Figure 4:
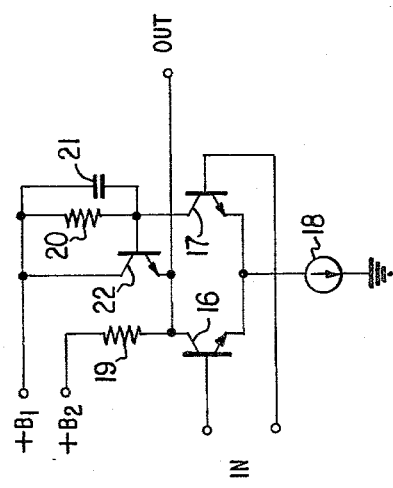
FIG. 4 is a circuit diagram of the FIG. 2 trigger pulse forming circuit to which a pulse shaping circuit is connected.

FIG. 4 is a circuit diagram of the FIG. 2 trigger pulse forming circuit to which a pulse shaping circuit is connected. In FIG. 4, the front stage is a circuit identical to the trigger pulse forming circuit shown in FIG. 2. The after stage circuit is the current switching circuit in which the emitters of transistors 10 and 11 are connected in common and the common emitter is grounded through a constant current source 12 to form an emitter-coupled differential amplifier. The base of transistor 10 is connected to the output terminal OUT of the trigger pulse forming circuit. The collector of transistor 10 is connected, through a load resistor 13, and the collector of transistor 11, directly, to power supply $+B_1$. Divider resistors 23 and 24 are connected serially between the power supply $+B_2$ and the ground terminal, and the common connection point of the divider resistors 23 and 24 is connected to the base of transistor 11 and the collector of transistor 10 is connected to the output terminal $OUT_1$.

In the above-mentioned FIG. 4 circuit, the output voltage of the trigger pulse forming circuit is the pulse of the high level $+V_{B2}$ and the low level $(V_{B2}-I_0R_1)$ shown by $V_1$ in FIG. 3(b). When this voltage exceeds the voltage impressed on the base of transistor 11, that is, the threshold voltage of the current switching circuit, transistor 10 becomes conductive. When it drops below the above threshold voltage, transistor 10 becomes nonconductive, and the output voltage phase of the trigger pulse forming circuit becomes reversed and obtained as a shaped output pulse signal from the output terminal $OUT_1$. In this case, the threshold voltage of the current switching circuit can be set readily by dividing the voltage $V_{B2}$ of the power supply $+B_2$ with divider resistors 23 and 24 in such a way that the output of the trigger pulse forming circuit accurately crosses the threshold voltage of the current switching circuit. Furthermore, by establishing the threshold voltage of the current switching circuit at a value near the power supply $+B_2$ voltage, fluctuation in the output width with respect to irregularity and drift of circuit element values is lessened and the pulse is stabilized.

As explained above, when this invention is applied, the trigger pulse forming circuit can be easily converted to an integrated circuit even when the electrostatic capacitance of the capacitor of the integrating circuit is low without decreasing the driving capacity of the next stage circuits. Also, compared with the trigger pulse forming circuit of FIG. 1, the number of circuit elements is reduced as two diodes are replaced by one transistor. Further, when the pulse shaping circuit is connected in the next stage, the threshold level of the pulse shaping circuit can be readily set, and a stable trigger pulse can be obtained even though the circuit element values are irregular and drifting.

Figure 5:
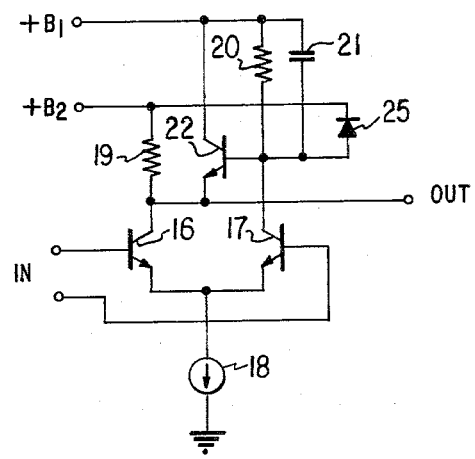
FIG. 5 is a circuit diagram of a modified embodiment of the trigger pulse forming circuit of FIG. 2.

The circuit diagram of FIG. 5 corresponds to that of FIG. 2 and additionally includes a diode 25 connected between the collector of transistor 17 and power supply $+B_2$.

Figure 6:
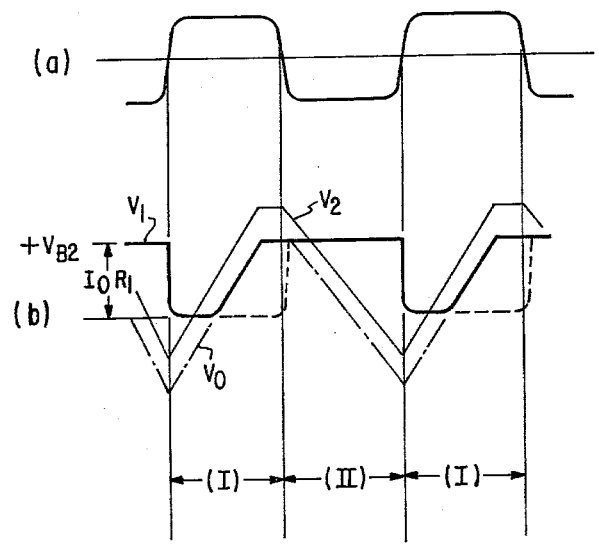
FIGS. 6(a) and (b) are diagrams of waveforms explaining the operation of the circuit of FIG. 5.

The operation of the trigger pulse forming circuit of FIG. 5 will now be described. When an input pulse signal such as shown in FIG. 6(a) is impressed between the bases of transistors 16 and 17 as an input and a certain level set as a threshold level, transistor 16 becomes conductive when the input pulse signal exceeds the said level and transistor 17 becomes nonconductive. This state is shown as state (I). When the input pulse signal decreases below the above level, transistor 16 becomes nonconductive and transistor 17 becomes conductive. This state is shown as state (II).

First, when the input pulse signal changes from state (II) to state (I), transistor 16 changes from nonconductive to conductive and transistor 17 changes from conductive to nonconductive And, as shown in FIG. 6(b), the collector voltage $V_1$ of transistor 16 changes from the voltage $V_{B2}$ of the power supply $+B_2$ to $(V_{B2}-I_0R_1)$. On the other hand, the load of the capacitor 21 is discharged because transistor 17 becomes nonconductive and the collector voltage $V_2$ of transistor 17 increases according to the time constant defined by the product of the resistance $R_2$ of load resistor 20 and the electrostatic capacitance C of capacitor 21, $R_2 \cdot C$. However, when the forward voltage drop of diode 25 during conduction is $V_D$, the increase in transistor 17 collector voltage $V_2$ is clamped at the voltage of $(V_{B2}+V_D)$ and ceases at a voltage of $(V_{B2}+V_D)$ due to the fact that diode 25 becomes conductive at a voltage where the relationship of $V_{B2}+V_D < V_2$ is satisfied. The collector voltage $V_1$ of the transistor 16 is at $(V_{B2}-I_0R_1)$ as stated above. However, when the forward voltage drop between the base and the emitter of the transistor 22 is $V_{BE3}$, the transistor 22 becomes conductive in the range where the $V_2-V_{BE3} > V_{B2}-I_0R_1$ relation holds for transistor 22. The collector voltage $V_1$ of transistor 16 becomes $(V_2-V_{BE3})$ and increases according to the collector voltage $V_2$ of the transistor 17. However, the upper limit of the transistor 17 collector voltage $V_2$ is $(V_{B2}+V_D)$ as stated above and because $V_D \approx V_{BE3}$, the upper limit of the transistor 16 collector voltage $V_1$ becomes $V_{B2}$, and the high level of the output pulse becomes constant at a voltage of $V_{B2}$ as shown in FIG. 6(b). In FIG. 6(b), the dot and line curve $V_0$ shows the changes in the $V_0=(V_2-V_{BE3})$ values.

Next, when the state of the input pulse signal changes from state (I) to state (II), transistor 16 becomes nonconductive, and transistor 17 becomes conductive. The collector voltage $V_2$ of transistor 17 decreases according to the characteristic of constant current source 18 and capacitor 21 until the state of the input pulse signal switches to state (I) again, or when $V_2=V_{B1}-I_0R_2$ results. Meanwhile, the collector voltage $V_1$ of transistor 16 tends to approach the voltage of power supply $+B_2$, $V_{B2}$. But, while transistor 22 is conductive, the potential is determined by $V_2$, and it becomes $V_{B2}$ when the transistor 22 becomes nonconductive. And, it remains at the voltage $V_{B2}$ until the input pulse signal is switched to state (I) again. Subsequently, the state of the input pulse signal changes from state (II) to state (I) and one cycle is completed.

The above operation indicates the collector voltage $V_1$ of transistor 16, namely the voltage outputted at the output terminal OUT, becomes, because of transistor 22, the voltage of the higher side of either the collector voltage of transistor 16 when the collector of transistor 16 and the emitter of the transistor 22 are disconnected, i.e. transistor 22 is not used, as shown with a broken line in FIG. 6(b), or the emitter voltage $(V_2-V_{BE3})$ of transistor 22 shown as $V_0$ in FIG. 3(b). In FIG. 3(b), the line showing wave form at OUT is drawn on a part of the broken line showing the collector voltage of transistor 16 when transistor 22 is not used, or the dot and line showing $V_0$. The broken line curve and the dot and line curve form square wave and clipped saw-tooth wave respectively. This is equivalent to performing an AND-operation with transistor 22 for the collector voltage of transistor 16, when the collector of the transistor 16 and the emitter of the transistor 22 are disconnected and the emitter voltage $(V_2-V_{BE3})$ of transistor 22, and it forms a trigger pulse that is synchronized to the input pulse signal.

Figure 7:
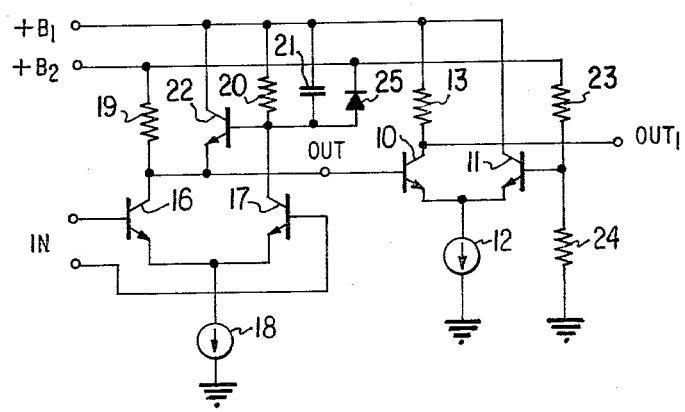
FIG. 7 is a circuit diagram of the FIG. 5 trigger pulse forming circuit to which a pulse shaping circuit is connected.

FIG. 7 is a circuit diagram of the FIG. 5 trigger pulse forming circuit to which a phase-inverting pulse shaping circuit is connected. In FIG. 7, the front stage is a circuit identical to the trigger pulse forming circuit shown in FIG. 5. The after stage circuit is the current switching circuit of FIG. 4.

In the above-mentioned FIG. 7 circuit, the output voltage of the trigger pulse forming circuit is the pulse of the high level $+V_{B2}$ and the low level $(V_{B2}-I_0R_1)$ shown by $V_1$ in FIG. 6(b). When this voltage exceeds the voltage impressed on the base of transistor 11, that is, the threshold voltage of the current switching circuit, transistor 10 becomes conductive. When it drops below the above threshold voltage, transistor 10 becomes nonconductive, and the output voltage phase of the trigger pulse forming circuit becomes reversed and is obtained as a shaped output pulse signal from the output terminal $OUT_1$. In this case, the threshold voltage of the current switching circuit can be set readily by dividing the voltage $V_{B2}$ of power supply $+B_2$ with divider resistors 23 and 24 in such a way that the output of the trigger pulse forming circuit accurately crosses the threshold voltage of the current switching circuit. Furthermore, by holding the threshold voltage of the current switching circuit near the power supply $+B_2$ voltage, fluctuation in the pulse width and amplitude with respect to irregularity and drift of circuit element values is lessened and the pulse is stabilized.

In addition, the high level of the output voltage of the trigger pulse forming circuit is clamped at the voltage of the power supply $+B_2$, $V_{B2}$ and constant regardless of the setting of power supply voltages and the time constant of the integrating circuit or change in the pulse width of the input pulse signal. Thus, the probability of saturating transistor 10 is small.

As stated above, the trigger pulse forming circuit of the present invention can be easily converted to an integrated circuit even when the electrostatic capacitance of the capacitor of the integrating circuit is low without decreasing the driving capacity for driving the next stage circuits. Also, compared with the pulse forming circuit of FIG. 1, the circuit configuration is no more complex and the number of circuit elements is the same. When a phase-inverting pulse shaping circuit is connected in the next stage, the threshold level of the pulse shaping circuit can be readily set and the probability of saturating the transistor of the pulse shaping circuit is small. Thus, the design of the next stage circuit is simplified, and a stable trigger pulse can be obtained even with irregularities and drifts of circuit element values.

What is claimed is:

1. A trigger pulse forming circuit comprising
   a first power supply;
   a second power supply having a common polarity with said first power supply whose voltage level is different than that of said first power supply;
   a differential amplifier including a first transistor whose operating voltage is supplied from the first power supply and a second transistor whose operating voltage is supplied from a second power supply, at least said first transistor being adapted for application thereto of an input pulse signal;
   a load resistor connected between an output terminal of said first transistor and said second power supply;
   an integrating circuit connected between an output terminal of said second transistor and said first power supply; and
   a third transistor whose base and collector are connected respectively to opposite ends of said integrating circuit and its emitter is connected to the output terminal of said first transistor whereby the trigger pulse output is obtained from the output terminal of said first transistor.

2. A trigger pulse forming circuit as in claim 1 including a diode whose anode is connected to the output terminal of said second transistor and whose cathode is connected to said first power supply.

3. Circuitry as in claim 2 including output circuitry connected to said output terminal of said first transistor, said output circuitry including transistors whereby the probability of said trigger pulse output saturating the output circuitry transistors is substantially lessened due to the clamping action of said diode.

4. Circuitry as in claim 3 where said trigger pulse forming circuit and output circuitry are each emitter-coupled differential amplifiers.

5. A trigger pulse forming circuit as in claim 1 where said second power supply voltage is greater than that of said first power supply.

6. Circuitry as in claim 1 where said trigger pulse forming circuit is an integrated circuit.

* * * * *